United States Patent [19]

Park et al.

[11] Patent Number: 5,116,773
[45] Date of Patent: May 26, 1992

[54] METHOD FOR MANUFACTURING A JUNCTION FIELD EFFECT TRANSISTOR

[75] Inventors: Ki S. Park, DongKu; Sang B. Kim; Kwang Y. Oh, both of YuseongKu; Yong T. Lee, JungKu, all of Rep. of Korea

[73] Assignee: Electronics and Telecommunications Research Institute, Daejeon, Rep. of Korea

[21] Appl. No.: 633,789

[22] Filed: Dec. 26, 1990

[30] Foreign Application Priority Data

Dec. 27, 1989 [KR] Rep. of Korea ............... 1989-19572

[51] Int. Cl.⁵ .................. H01L 21/265; H01L 21/20; H01L 21/208
[52] U.S. Cl. ...................... 437/41; 437/22; 437/911
[58] Field of Search .......... 437/29, 126, 41, 91, 437/133, 130, 77, 175, 176, 184, 944, DIG. 110; 357/16; 148/DIG. 66, DIG. 100, DIG. 65; 156/643

[56] References Cited

U.S. PATENT DOCUMENTS

| | | | |
|---|---|---|---|
| 4,075,652 | 2/1978 | Umebachi et al. | 148/DIG. 139 |
| 4,700,462 | 10/1987 | Beaubien et al. | 437/187 |
| 4,774,206 | 9/1988 | Willer | 437/203 |

FOREIGN PATENT DOCUMENTS

| | | | |
|---|---|---|---|
| 0003776 | 1/1978 | Japan | 437/133 |
| 0163666 | 7/1986 | Japan | 156/643 |
| 0233767 | 9/1989 | Japan | 357/16 |

Primary Examiner—Olik Chaudhuri
Assistant Examiner—Loc Q. Trinh
Attorney, Agent, or Firm—Blakely, Sokoloff, Taylor & Zafman

[57] ABSTRACT

The present invention provides a method for manufacturing a field effect transistor which overcomes problems occurring in the manufacture of InP material junction field effect transistors. Because the electron saturation velocity is higher than that of silicon or GaAs it is desirable to have a gate length shorter than the mask length as well as to have the source, drain, and gate metals evaporated by the self-aligned method. The present invention provides a method of achieving gate lengths of 1 $\mu$m or shorter without requiring an expensive electron beam apparatus or X-ray lithography apparatus.

6 Claims, 3 Drawing Sheets

Fig. 3
Fig. 3A
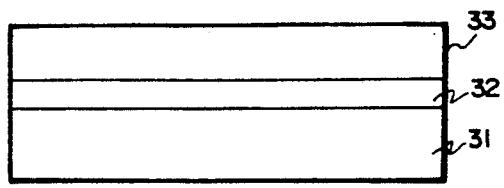
Fig. 3B
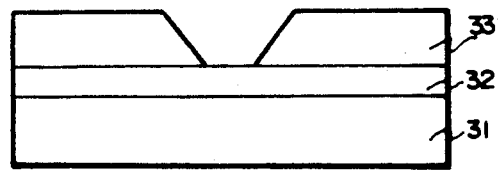
Fig. 3C
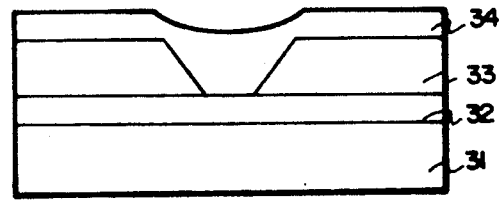
Fig. 3D
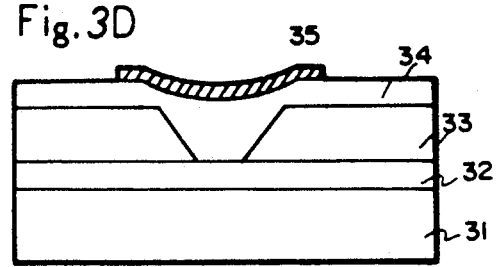
Fig. 3E
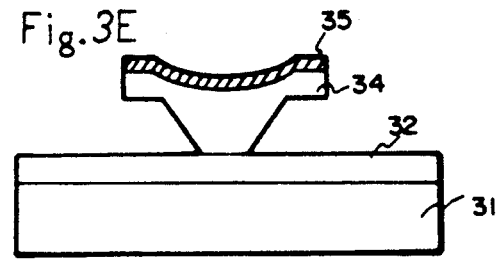
Fig. 3F
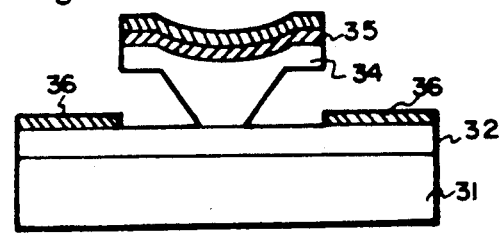

Fig. 4
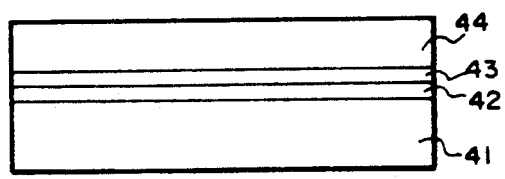
Fig. 4A
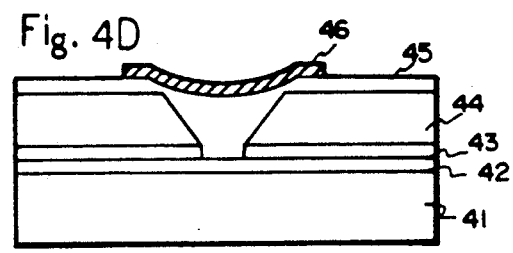
Fig. 4D
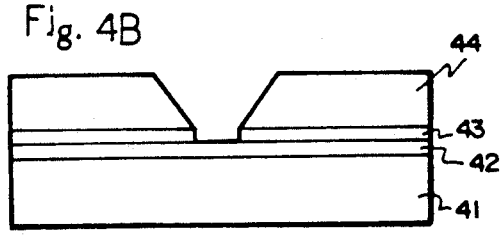
Fig. 4B
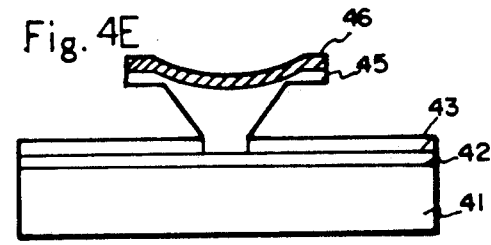
Fig. 4E
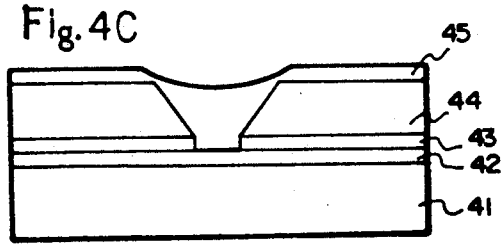
Fig. 4C
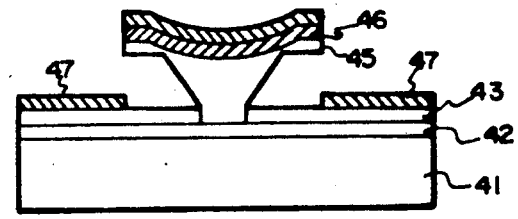
Fig. 4F

METHOD FOR MANUFACTURING A JUNCTION FIELD EFFECT TRANSISTOR

BACKGROUND OF THE INVENTION

1. Field of the Invention

The present invention relates to a junction type field effect transistor used in high frequency integrated circuits and optoelectronic integrated circuits and more particularly to a homojunction type and heterojunction field effect transistor of a self-aligned structure having a short gate length.

2. Information Disclosure Statement

Generally, in the manufacture of a junction field effect transistor, it has been known to that the manufacture of a PN junction below a gate is the most important technology.

The prior art methods for manufacturing the PN junction below the gate metal are as follows;

First, the method of diffusing a P type dopant into a N type channel layer;

Next, the method of implanting a P type dopant ion into a N type channel layer;

Next, the method of etching an undesired portion after growing an P type epitaxial layer on a N type channel layer.

However, in view of that the length the gate electrode must be short in order to obtain large transconductance and high cut-off frequency, there are some problems in the above mentioned prior art methods.

The method of manufacturing JFET by a diffusion and implantation is not reproducible since thickness control of a channel layer resulted in P dopant diffusion is difficult, and manufacture of JFET having a short gate below 1~2 μm is difficult because of non-self-aligned structure.

When the junction forming technology by the P type epitaxial layer growth method is used, there is a problem in that the etching control is difficult and not reproducible, whereas the short gate length and self-aligned structure can be obtained.

Accordingly, it is an object of the present invention to solve above mentioned problems.

It is a purpose of the present invention to provide a method for manufacturing a junction field effect transistor in which the problem occuring in the manufacture of the junction field effect transistor of the InP type materials having an electron saturation velocity higher than that of silicon or GaAs, that is, the problem of the restriction of the gate length, is eliminated, further a gate length shorter than the mask length is obtained and the source, drain and gate metal are evaporated by the self-align method, to thereby obtain a gate length 1 μm or a gate length shorter than 1 μm without utilizing an electron beam apparatus with high cost or X-ray lithography apparatus.

SUMMARY OF THE INVENTION

A method for manufacturing a junction field effect transistor of the present invention is defined by the claims with a specific embodiment shown in the attached drawings.

The invention relates to a method for manufacturing a homojunction field effect transistor comprising: a first epitaxy growth process for growing a N type InP channel layer and GaInAs(P) layer on a semi-insulating substrate, a selective etching process of said GaInAs(P) layer for making an etching mask of photoresistor by lithography and, thereafter, for selectively anisotropically etching only said GaInAs(P) layer by using a selective etching solution, a second epitaxy growth process for removing entirely said photoresistor pattern and for growing the P type InP layer for the PN junction thereon, a gate metal evaporation process for evaporating a metal which is in ohmic contact with said P type InP layer, to thereby form a gate electrode, a selective etching process of the P type InP layer and GaInAs(P) layer for etching selectively said P type InP layer by using an etching mask as a gate metal and for forming large under-cuts near the both sides of the PN junction by selectively etching the GaInAs(P) layer which is exposed on surface after said selective etching is completed, a source and drain metal evaporation process for forming a source and drain electrode by evaporating the metal which is in ohmic contact with the N type InP layer, to thereby obtain a gate length L shorter than a length W on the photoresistor pattern mask by selective mesa etching and obtain an electrode by the self-align method, a method for manufacturing a heterojunction type field effect transistor comprising: a first epitaxy growth process for growing a N type GaInAs(P) channel layer, an N type InP layer and GaInAs(P) layer on a semi-insulating substrate, a selective etching process of said GaInAs(P) layer and N type InP layer for making an etching mask of photoresistor by lithography and, thereafter, for selectively anisotropically etching said GaInAs(P) layer by using a selective etching solution and selectively etching said N type InP layer additionally, a second epitaxy growth process for removing entirely said photoresistor pattern and for growing the P type InP layer for PN junction thereon, a gate metal evaporation process for evaporating a metal which is in ohmic contact with said P type InP layer, to thereby form a gate electrode, a selective etching process of the P type InP layer and GaInAs(P) layer for etching selectively said P type InP layer by using an etching mask as a gate metal and for forming large under-cuts near both sides of the PN junction by selectively etching the GaInAs(P) layer which is exposed on the surface after said selective etching is completed, a sorce and drain metal evaporation process for forming a source and drain electrode by evaporating the metal which is in ohmic contact with the N type InP layer, to thereby obtain a gate length L shorter than a length W on the mask determined by the lithography and to obtain an electrode by the self-align method.

BRIEF DESCRIPTION OF THE DRAWINGS

For understanding of the nature and objects of the invention, reference should be had to the following detailed description taken in conjunction with the accompanying drawings in which;

FIG. 3A through 3F illustrate a cross-sectional views of a InP homojunction field effect transistor in which each manufacturing process is illustrated sequentially.

FIG. 4A through 4F illustrate cross-sectional views of a heterojunction field effect transistor in which each manufacturing process is illustrated sequentially.

DETAILED DESCRIPTION

Figure 1:
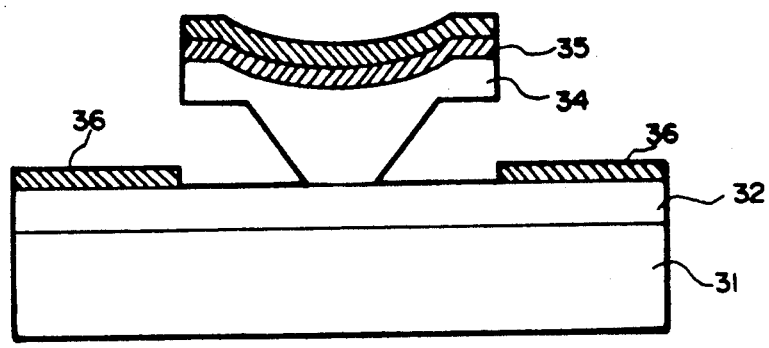
FIG. 1 illustrates a cross-sectional view of a InP homojunction field effect transistor.

FIG. 1 illustrates the cross sectional view of a InP type homojunction field effect transistor according to the present invention.

Referring to FIG. 1, a N type InP channel layer 32 and GaInAs(P) layer are grown on the semi-insulating InP substrate 31, thereafter, only a GaInAs(P) layer is anisotropically selectively etched using a selective etching solution, to thereby expose a (111) In layer.

Next, a highly doped P type InP layer 34 is grown for forming a PN junction so that the homojunction type PN junctior is formed below an etching portion, to thereby form a gate 35. In FIG. 1, the number 36 shows a drain and a source.

Figure 2:
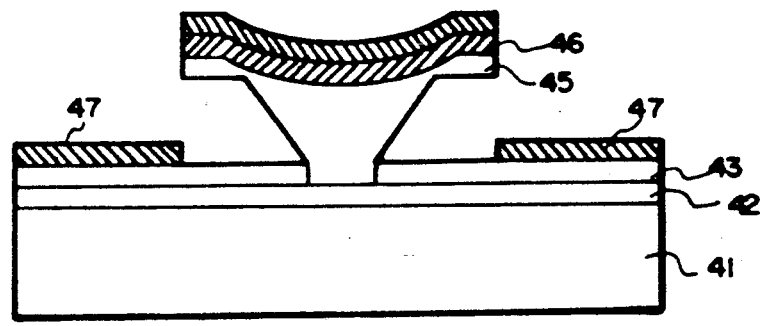
FIG. 2 illustrates a cross-sectional view of a GaInAs(P) heterojunction field effect transistor.

FIG. 2 illustrates the cross-sectional view of a heterojunction field effect transistor.

Referring to FIG. 2, a N type GaInAs(P) channel layer 42 and a N type InP 43 and GaInAs(P) layer are grown on a semi-insulating InP substrate 41, thereafter, the GaInAs(P) layer is anisotropically selectively etched and the N type InP layer is selectively etched additionally.

Next, a highly doped P type InP layer is grown so that a heterojunction type PN junction is formed, to thereby form a gate 46.

It should be noted that the length of the gate is determined as follows;

$$L = W - 2d/\tan\theta$$

(Here, L = the length of the gate,
W = the length of the gate on the mask determined by the mask for etching,
d = the thickness of the GaInAs(P) layer,
$\theta$ = the angle of the anisotropic etching)

The thickness d is determined by an epitaxial growth so that the thickness below 0.1 μm can be controlled and if the surface (111) is exposed by utilizing the selective etching solution, the etching angle $\theta$, that is, a reproducible angle of 54.44°, is obtained.

Accordingly, though the gate length W on the mask determined by a lithography is long, the short length L of the gate is obtained by the control of the thickness of the epitaxial layer.

Thereafter, the gate metal having a length larger than the length W of the gate electrode formed on the mask is evaporated by a lift-off process and the P type InP layer formed on the porting except for the gate metal is selectively etched. Next, the GaInAs(P) layer is selectively etched.

Thereafter, the metal which is in ohmic contact with the N type InP layer is evaporated so that the self-aliged source electrode 47 and drain electrode 47 is formed, owing to the under-cut formed below the P type InP layer.

FIG. 3A through 3F illustrate cross-sectional view of the InP homojunction field effect transistor in which each manufacturing process is illustrated sequentially according to the present invention.

Here, a first epitaxy growth layer is formed on the semi-insulating InP substrate as shown in FIG. 3A. Thereafter, the GaInAs(P) layer is selectively anisotropically etched for determining the gate length L as shown in FIG. 3B. A second epitaxy growth process is completed on the P type InP layer as shown in FIG. 3C, and the gate metal is evaporated thereon by a lift-off process as shown in FIG. 3D. A P-type InP layer of the surface and a GaInAs(P) layer are selectively etched as shown in FIG. 3E, next, a source and drain metal of self-aligned structure are evaporated by the lift-off process as shown in FIG. 3F.

The manufacturing sequence of the above mentioned homojunction field effect transistor are described as follows.

In the first epitaxy growth in FIG. 3A, a N type InP channel layer 32 and a GaInAs(P) layer 33 are grown on a simi-insulating InP substrate 31 by using a liquid phase epitaxy method (LPE) or an organometallic vapour phase epitaxy method (OMVPE).

Here, the thickness of the GaInAs(P) layer 32 determines the length of the gate as mentioned above.

In the selective etching process of the GaInAs(P) layer in FIG. 3B, an etching mask of a photoresistor is formed by lithography. Next, only the GaInAs(P) layer 33 is selectively anisotropically etched by using a selective etching solution. An etching surface is (111) In surface having an etching angle about 54.44°.

In a second epitaxy growth in FIG. 3C, after the photoresistor pattern for etching mask is entirely removed, the second epitaxy growth is accomplished in order to form a PN junction.

Here, the doping concentration of the P type InP layer is above $10^{18}$ cm$^{-3}$, the high doping concentration is desirable.

In the gate metal evaporation process in FIG. 3D, after the second epitaxy growth is completed, a gate metal 35 is evaporated by utilizing the lift-off method.

In the selective etching process of the InP layer and GaInAs(P) layer in FIG. 3E, the InP layer 34 is selectively etched by using the gate metal 35 formed in the previous process as the etching mask and thereafter, the GaInAs(P) layer 33 exposed on the surface is selectively etched.

After the etching process is completed, a large undercut is formed on both sides of the PN junction as shown in drawing.

In the source and the drain metal evaporation process in FIG. 3F, the metal which is in N type ohmic contact with the InP, for example, the Au-Ge/Au is evaporated by using the lift-off method, to thereby form source and drain electrodes 36.

Here, if the metal is evaporated without distinction of the source, drain and gate, each electrode is self-aligned, owing to the under-cut formed in the previous process.

FIG. 4A through 4F illustrate cross-sectional view of the GaInAs(P) heterojunction field effect transistor in which each manufacturing process is illustrated sequentially according to the present invention.

Here, a first epitaxy growth is completed on the semi-insulating InP substrate as shown in FIG. 4A. An anisotropic etching process of the GaInAs(P) layer and selective etching process of the InP layer are completed for determining the gate length L in FIG. 4B. A second epitaxy growth process of the P type InP layher is completed in FIG. 4C. A gate metal is evaporated thereon by a lift-off process in FIG. 4D. An P tpye InP layer of the surface and GaInAs(P) are selectively etched in FIG. 4E. A source and a drain metals of the self-aligning structure are evaporated by a lift-off process FIG. 4F.

The manufacturing sequence of the above mentioned hetero-junction field jeffect transistor is described as follows.

In the first epitaxy growth in FIG. 4A, a N type GaInAs(P) channel layer 42, N type InP layer 43 and GaInAs(P) layer 44 are grown on a semi-insulating InP substrate 41 by the LPE method or OMVPE method.

Here, the thickness of the GaInAs(P) layer 44 determines the length of the gate as mentioned above.

In the selective etching process of the GaInAs(P) layer and N type InP layer in FIG. 4B, after an etching mask of the photoresist is formed by lithography, only GaInAs(P) layer 44 is selectively aniotropically etched by using the selective etching solution.

Next, the N type InP layer 43 is selectively etched.

Here, the etching surface of the GaInAs(P) layer is (111) In surface having an etching angle about 54.44°.

In a second epitaxy process in FIG. 4C, after the photoresistor pattern for etching mask is entirely remove, the second epitaxy growth is accomplished in order to form a PN junction.

Here, the doping concentration of the P type InP layer is above $10^{18}$ cm$^{-1}$, the high doping concentration is desirable.

In the gate metal evaporation process in FIG. 4D, after the second epitaxy growth is completed, a gate metal 46 is evaporated by utilizing the lift-off method.

In the selective etching process of the InP layer and GaInAs(P) layer in FIG. 4E, the InP layer 45 is selectively etched by using the gate metal 46 formed in the previous process as the etching mask and thereafter, the GaInAs(P) layer exposed on the surface is selectively etched.

After the etching process is completed, a large under-cut is formed on both sides of the PN junction as shown in drawing.

In the source and the drain metal evaporation process in FIG. 4F, the metal which is in N type ohmic contact with the InP is evaporated by uing the lift off method, to thereby form source and drain electrodes 47.

Here, if the metal is evaporated without distinction of the source, drain and gate, each electrode is self-aligned, owing to the under-cut formed in the previous process.

It is noted that the present invention has a plurality of alternatives to those examples as described in FIG. 3 and FIG. 4.

First, if the first channel layer formed on the semi-insulating InP substrate in the first epitaxy growth (FIG. 3A and FIG. 4A) is the GaInAs layer and the second layer which determines the gate length by using the anisotropic selective etching is the InP layer, the P type InP layer 34 in FIG. 3C and the P type InP layer 45 in FIG. 4C grown in the second epitaxy process can be substitued for the P type GaInAs(P) layer.

Second, the method for manufacturing the junction field effect transistor can be applied to a GaAs structure without variance of the structure.

That is, a GaAs layer instead of the InP layer can be grown on a semi-insulating GaAs substrate and an AlGaAs layer instead of the GaInAs(P) can be grown thereon.

The field effect transistor having a short gate length and manufactured by the above mentioned method has a high transconductance and cut-off frequency so that the field effect transistor may be applied to the high frequency devices and integrated circuits.

Also, the field effect transistor can be integrated with the GaInAs long wavelength photo-detector in a single chip so that can be applied to an optical receiver of the optical communication system having a high velocity and very large capacity without variance of the structure.

the junction field effect transistor accordiang to the present invention has the following benefits in contrast with the prior art transistor:

1) As the diffusing process or activation process is not used, widening of the gate length owing to the dopant diffusion does not occur.

2) In the etching process for forming a gate, the gate length W on the mask is much longer than the practical gate length L so that the lithography process can be easily accomplished.

3) The manufacture according to the present invention can be simply accomplished because of the self-aligned structure.

4) In the case of the heterojunction type, the Zn diffusion effect in the channal layer of the GaInAs(P) is significantly decreased in contrast with InP layer, to thereby obtain a rapid PN junction during a crystal growth process.

What is claimed is:

1. A method for manufacturing a heterojunction type field effect transistor comprising:
   a first epitaxy growth process for growing a N type GaInAs(P) channel layer, a N type InP layer and a GaInAs(P) layer on a semi-insulating substrate,
   a selective etching process of the GaInAs(P) layer and the N type InP layer for selectively anisotropically etching only the GaInAs(P) layer by using a selective etching solution, and selectively etching the N type InP layer additionally, after lithographically forming an etching mask of photoresist,
   a second epitaxy growth process for growing a P type InP layer for a PN junction after removing entirely the photoresist pattern,
   a gate metal evaporation process for evaporating a metal which is in ohmic contact with the P type InP layer, to thereby form a gate electrode,
   a selective etching process of the P type InP layer and the GaInAs(P) layer for etching selectively the P type InP layer by using an etching mask as a gate metal and for forming large under-cuts near both sides of the PN junction by selectively etching the GaInAs(P) layer which is exposed on surface after said selective etching is completed,
   a source and drain metal evaporation process for forming source and drain electrodes by evaporating a metal which is in ohmic contact with the N type InP layer, to thereby obtain a gate length L shorter than a length W on mask determined by the lithography method and to obtain electrodes by a self-aligning method.

2. The method for manufacturing a heterojunction type field effect transistor of claim 1, wherein the P type InP layer formed in said second epitaxy process is grown by a liquid phase epitaxy(LPE) method.

3. The method for manufacturing a heterojunction type field effect transistor of claim 1, wherein the P type InP layer formed in said second epitaxy process is grown by the organometallic vapor phase epitaxy(OMVPE) method.

4. The method for manufacturing a heterojunction type field effect transistor of claim 1., wherein, in said source and drain metal evaporation process, the metal is evaporated on entire surface without distinction of the electrodes by the lift-off method using the under-cut formed in previous process, to thereby form a self-aligned structure.

5. A method for manufacturing a junction type field effect transistor comprising:

a first epitaxy growth process for growing a GaInAs channel layer as a channel layer in a semi-insulating substrate and, thereafter, growing a InP layer as a second layer thereon a selective etching process of the InP layer for selectively anisotropically etching only the InP layer by using a selective etching solution, after lithographically forming an etching mask of photoresist, a second epitaxy growth process for growing a P type InP layer for a PN junction after removing entirely the photoresist pattern, a gate metal evaporation process for evaporating a metal which is in ohmic contact with the P type GaInAs layer, to thereby form a gate electrode, a selective etching process of the P type GaInAs layer and the InP layer for etching selectively the GaInAs layer by using an etching mask as a gate metal and for forming large under-cuts near both sides of the PN junction by selectively etching the InP layer which is exposed on the surface after the selective etching is completed, a source and a drain metal evaporation process for forming source and drain electrodes by evaporating a metal which is in ohmic contact with the GaInAs channel layer formed on the substrate to thereby obtain a gate length L shorter than a width W on mask determined by the lithography and to obtain an electrode by a self-aligning method.

6. The method for manufacturing a junction type field effect transistor of claim 5, wherein the three-element compound layer of the GaInAs formed in said second epitaxy process is grown by the organometallic vapor phase epitaxy method.

* * * * *

UNITED STATES PATENT AND TRADEMARK OFFICE
CERTIFICATE OF CORRECTION

PATENT NO. : 5,116,773

DATED : May 26, 1992

INVENTOR(S) : Park et al.

Page 1 of 2

It is certified that error appears in the above-indentified patent and that said Letters Patent is hereby corrected as shown below:

In column 1 at line 47 change "of the InP" to --of InP--;
at line 50 change "eliminated, further" to
--eliminated. Further,--.

In column 2 at line 12 change "near the both" to --near both--;
at line 21 change "method, a" to --method. A--;
at line 46 change "sorce" to --source--.

In column 3 at line 52 change "self-aliged" to -self-aligned--.

UNITED STATES PATENT AND TRADEMARK OFFICE
CERTIFICATE OF CORRECTION

PATENT NO. : 5,116,773
DATED : May 26, 1992
INVENTOR(S) : Park et al.

It is certified that error appears in the above-indentified patent and that said Letters Patent is hereby corrected as shown below:

In column 4 at line 1 change "FIG. 3E, next," to
--FIG. 3E. Next,--;
at line 9 change "simi-insulating" to --semi-insulating--;
at lines 10-11 change "vapour" to --vapor--;
at line 57 change "layher" to --layer--;
at line 59 change "tpye" to --type--;
at line 65 change "jeffect" to --effect--.

In column 5 at line 18 change "$10^{18}cm^{-1}$" to --$10^{18}cm^{-3}$--;
at line 61 change "to the high" to --to high--.

In column 6 at line 1 change "the junction" to --The junction--.

Signed and Sealed this

Thirteenth Day of June, 1995

Attest:

BRUCE LEHMAN

Attesting Officer    Commissioner of Patents and Trademarks